(12) United States Patent
Voegele

(10) Patent No.: US 7,990,196 B2
(45) Date of Patent: Aug. 2, 2011

(54) SIGNAL DRIVER WITH FIRST PULSE BOOST

(75) Inventor: Kevin D. Voegele, Shakopee, MN (US)

(73) Assignee: Toshiba America Electronic Components, Inc., Irvine, CA (US)

( * ) Notice: Subject to any disclaimer, the term of this patent is extended or adjusted under 35 U.S.C. 154(b) by 0 days.

(21) Appl. No.: 12/644,740

(22) Filed: Dec. 22, 2009

(65) Prior Publication Data

US 2011/0148494 A1 Jun. 23, 2011

(51) Int. Cl.
*H03K 7/02* (2006.01)
(52) U.S. Cl. .................................. 327/178; 327/108
(58) Field of Classification Search .................. 327/178, 327/179
See application file for complete search history.

(56) References Cited

U.S. PATENT DOCUMENTS

| 3,959,714 A | | 5/1976 | Mihelich |
| 5,592,072 A | * | 1/1997 | Brown .......................... 323/268 |
| 5,726,845 A | * | 3/1998 | Ho ................................. 361/86 |
| 5,747,976 A | * | 5/1998 | Wong et al. ................... 323/282 |
| 6,943,536 B2 | | 9/2005 | Marino et al. |
| 7,006,813 B2 | | 2/2006 | Staszewski et al. |
| 7,423,471 B2 | * | 9/2008 | Ueda ............................. 327/309 |
| 7,579,817 B2 | * | 8/2009 | Agari et al. ................... 323/282 |
| 2002/0153940 A1 | * | 10/2002 | Wurcer et al. ................ 327/536 |
| 2003/0046598 A1 | | 3/2003 | Crafts et al. |
| 2004/0174149 A1 | * | 9/2004 | Agari et al. ................... 323/271 |
| 2005/0052171 A1 | * | 3/2005 | Horimoto ...................... 323/282 |
| 2006/0152205 A1 | | 7/2006 | Tang et al. |
| 2008/0030181 A1 | | 2/2008 | Liu et al. |
| 2008/0246450 A1 | | 10/2008 | Matyas et al. |
| 2009/0167267 A1 | * | 7/2009 | Dwarakanath et al. ....... 323/282 |

FOREIGN PATENT DOCUMENTS

JP 2005-0174351 6/2005

* cited by examiner

*Primary Examiner* — Lincoln Donovan
*Assistant Examiner* — Ryan C Jager
(74) *Attorney, Agent, or Firm* — Tucker Ellis & West LLP

(57) ABSTRACT

A driver boost signaling circuit provides a pulse boost to the first cycle of an output pulse wave applied to an associated load. The circuit includes a signal generator circuit generating a signal including a series of pulses, a determining circuit determining a high impedance state of a signal load line and a first one or more cycles of the series of pulses applied to the load line following the high impedance condition, and a receiving circuit receiving a control signal. A logic circuit generates first and second logical signals responsive to the control signal and to the determining circuit determining the first one or more cycles and other cycles of the series of pulses. A switchable impedance circuit coupling the signal generator with the associated load line is responsive to the first logical signal to provide a low impedance level between the signal generator circuit and the associated signal load line, and to the second logical signal to provide a high impedance level between the signal generator circuit and the associated signal load line.

20 Claims, 8 Drawing Sheets

| FIRST CYCLE SIGNAL (128) | CONTROL SIGNAL (160) | AUXILIARY CONTROL SIGNAL (162) | EFFECTIVE SERIES RESISTANCE |
|---|---|---|---|
| 0 | 0 | 0 | R1 |
| 0 | 0 | 1 | R1 |
| 0 | 1 | 0 | R1 |
| 0 | 1 | 1 | R1 |
| 1 | 0 | 0 | R1 |
| 1 | 0 | 1 | R1\|\|R3 |
| 1 | 1 | 0 | R1\|\|R2 |
| 1 | 1 | 1 | R1\|\|R2\|\|R3 |

SIGNAL DRIVER WITH FIRST PULSE BOOST

TECHNICAL FIELD

The present disclosure relates generally to circuits and methods that selectively provide a performance boost to signals such as pulses driving associated load lines.

BACKGROUND

Initial load capacitance inherent in signal load lines such as input and output (I/O) lines extending between a memory and another semiconductor device such as a processor, for example, can cause degradation in the early portion of pulse wave or other driving signals applied to those load lines following a high impedance state of the lines. This problem often manifests as a short or "thin" first pulse relative to the ensuing pulses following in the applied pulse wave signal applied after the high impedance condition of the load line.

One existing solution uses a series of "pre-charge" pulses applied to the signal load line prior to application of the pulse signal proper. The pre-charge pulse is not a driving signal per se, it contains no useful information, and is only used to temporarily compensate for the inherent initial load capacitance common in many signal load lines. Accordingly, this technique wastes time and energy.

Another existing solution is to configure the drive circuit with a low internal impedance to approximately match the zero start impedance of the signal load line to thereby apply a large drive current which is used for all signal pulses regardless of whether it is the initial pulse or any pulse subsequent to the first pulse. However, this too wastes energy. Further, the larger drive current developed for all pulses of the pulse wave signal can introduce other errors including, for example, simultaneous switching of output (SSO) errors.

Although a reduction in the length of the signal lines would be helpful to minimize the negative effects of the inherent capacitive characteristics thereof, in many cases it is not possible or practical to relocate the circuit components into closer mutual proximity.

BRIEF DESCRIPTION OF THE DRAWINGS

The accompanying drawings incorporated herein and forming a part of the specification illustrate the example embodiments.

OVERVIEW OF EXAMPLE EMBODIMENTS

Figure 1:
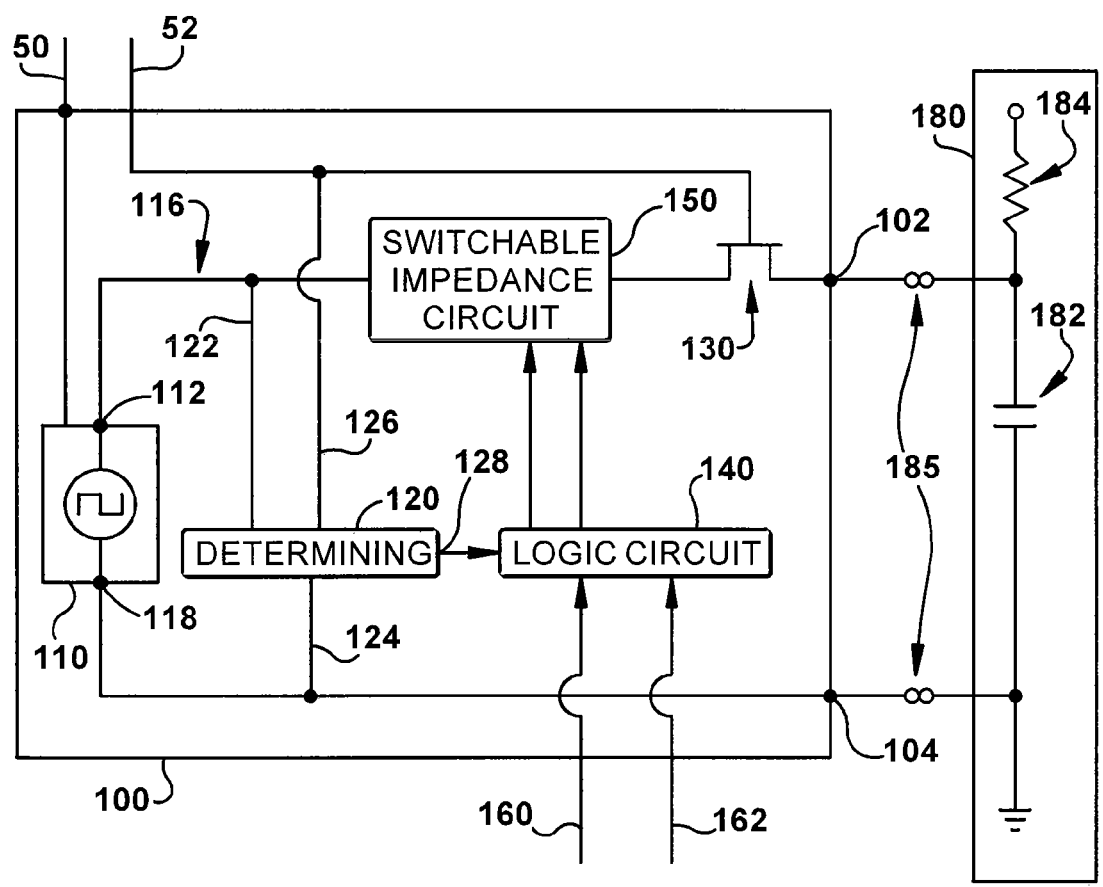
FIG. 1 illustrates an example of a circuit for implementing a first pulse boost in a signaling circuit.

The following presents a simplified overview of the example embodiments in order to provide a basic understanding of some aspects of the example embodiments. This overview is not an extensive overview of the example embodiments. It is intended to neither identify key or critical elements of the example embodiments nor delineate the scope of the appended claims. Its sole purpose is to present some concepts of the example embodiments in a simplified form as a prelude to the more detailed description that is presented later.

In accordance with an example embodiment, there is disclosed herein an apparatus including a signal generator configured to generate a signal including a series of pulses, and a switchable impedance circuit responsive to output from a logic circuit for selectively configuring the apparatus with a low internal impedance between the signal generator and a signal load line for the first set of one or more cycles of a series of pulses, but in one embodiment preferably only the first cycle of the series of pulses, following a high impedance state of the signal load line, and with a high internal impedance for subsequent cycles of the series of pulses and preferably for the second and all subsequent cycles of the series. Thus, a boost is provided only for the first one or more cycles of the output signal to compensate for inherent initial capacitance in the signal load line after the high impedance condition. The boost is not used thereafter. Rather, the circuit operates on a standard mode in accordance with the load line being transitioned off from the high impedance state by the application of the boosted first set of one or more cycles. The high impedance state includes a condition wherein the signal load lines "float" relative to the signal and/or ground.

During the boost duration, preferably lasting for the first pulse cycle, a portion of the energy transferred from the driver circuit is used to charge the load line capacitance, and the remainder is therefore available for driving the pulse signal on the load line in a manner and at levels consistent with the circuit specifications thereby avoiding errors. By using a boosting power signal only for the first cycle or for the initial one or more cycles following a high impedance state and configuring the driver circuit to use a nominal power setting signal for the following cycles in this way, the SSO errors are minimized without wasting time or energy as in the earlier circuits.

In accordance with a still further example embodiment, a method of first pulse boost is provided for use with a driver boost signaling circuit. The method includes generating, on an associated signal load line by a signal generator circuit of the boost signaling circuit, a signal including a series of pulses, and determining, by a determining circuit of the boost signaling circuit, a high impedance state of the signal load line and a first one or more pulses of the series of pulses, but in one embodiment preferably only the first cycle of the series. The method also includes receiving, by a receiving circuit of the boost signaling circuit, a control signal, and generating, by a logic circuit of the boost signaling circuit, a first logical signal responsive to the control signal and to the determining the high impedance and the first one or more pulses of the series of pulses, and a second logical signal different than the first logical signal responsive to the control signal and to the determining pulses of the series of pulses other than the first pulse. A further step of the method includes providing, by a switchable impedance circuit of the boost signaling circuit operatively coupling the signal generator with an associated signal load line, a first impedance level between the signal generator circuit and the associated signal load line responsive to the first logical signal of the logic circuit, and a second impedance level larger than the first impedance between the signal generator circuit and the associated signal load line responsive to the second logical signal of the logic circuit.

In accordance with a further example embodiment, there is disclosed herein a driver boost signaling circuit comprising a signal generator circuit configured to generate a signal including a series of pulses on a signal load line, and a determining circuit for determining a high impedance of the signal load line and a first set of one or more cycles of the series of pulses after the high impedance condition, preferably determining the first cycle of the series of pulses after the high impedance condition. A receiving circuit is configured to receive a control signal. A logic circuit is configured to generate a first logical signal responsive to the control signal and to the determining circuit determining the first cycle of the series of pulses, and a second logical signal different than the first logical signal responsive to the control signal and to the determining circuit determining cycles of the series of pulses other than the first cycle. A switchable impedance circuit is operatively coupled with the signal generator and an associated signal load line. The switchable impedance circuit is responsive to the first logical signal of the logic circuit to provide a first impedance level between the signal generator circuit and the associated signal load line, and is responsive to the second logical signal of the logic circuit to provide a second impedance level larger than the first impedance level between the signal generator circuit and the associated signal load line.

In accordance with a further example embodiment, there is disclosed herein an apparatus comprising signal generator means configured to generate a signal including a series of pulses, and determining means for determining, on an associated load line, a first one or more cycles of the series of pulses preferably in one embodiment for determining the first pulse or cycle of the series of pulses. Receiving means of the apparatus are configured to receive a control signal. Logic means of the apparatus are configured to generate a first logical signal responsive to the control signal and to the determining means determining the first set of one or more cycles of the series of pulses following a high impedance state of the associated load line, and a second logical signal different than the first logical signal responsive to the control signal and the determining means determining cycles of the series of pulses other than the first set of one or more cycles preferably in one embodiment determining cycles of the series of pulses other than the first cycle. A switchable impedance means is operatively coupled with the signal generator means and an associated signal load line. The switchable impedance means is responsive to the first logical signal of the logic means to provide a first impedance level between the signal generator means and the associated signal load line, and is responsive to the second logical signal of the logic means to provide a second impedance level larger than the first impedance level between the signal generator means and the associated signal load line.

DESCRIPTION OF EXAMPLE EMBODIMENTS

This description provides examples not intended to limit the scope of the appended claims. The figures generally indicate the features of the examples, where it is understood and appreciated that like reference numerals are used to refer to like elements. Reference in the specification to "one embodiment" or "an embodiment" or "an example embodiment" means that a particular feature, structure, or characteristic described is included in at least one embodiment described herein and does not imply that the feature, structure, or characteristic is present in all embodiments described herein.

In accordance with example embodiments, there are provided herein a method and driver boost signaling circuits and apparatus including a signal generator circuit with a switchable impedance circuit wherein the signal generator circuit is configured to generate a signal including a series of pulses with a boost pulse for the first cycle. The boost pulse delivers additional energy to the signal line relative to pulses of the signal following the boost pulse. In accordance with a further example embodiment, there is provided herein a driver boost signaling method wherein a signal including a series of pulses from a signal generator circuit including a switchable impedance circuit is generated with a boost pulse for the first cycle.

FIG. 1 illustrates an example of a circuit 100 for implementing an initial pulse boost for a signaling circuit in accordance with an example embodiment. The example circuit 100 is connected at output nodes 102, 104 with an associated load 180 via signal load lines 185. The circuit comprises a signal generator 110 configured to generate, at an output 112 thereof, a pulse signal 116. The signal generator 110 is responsive to a logic level of a first control signal 50 from an operatively associated external source (not shown) to selectively generate the pulse signal in accordance with the logic level of the signal 50. In the illustrated embodiments disclosed herein, the generated pulse signal 116 is a square wave having an average signal level of about 0.75 volts, a negative going portion of about 0.40 volts, and a positive going portion of about 1.15 volts. A cycle of the signal consists of a negative going portion followed by a positive going portion of the square wave. The initial negative or first negative going portion applied to the load after a high impedance state will be referred to herein as the "preamble" of the signal. The preamble also includes the first negative going portion of the signal following a transition of the logic level of the signal 50 turning the generator 110 on when a switch described below coupling the generator with the associated load is previously established in an on or conductive state.

Although the circuit will be described in connection with a square wave format signal, it is to be appreciated that the circuit 100 is configured for use with other signal types, formats and waveforms including cyclical, triangular, pulse train, sinusoidal and non-sinusoidal waveforms, symmetrical and non-symmetrical shaped waveforms or any other type of signal with one or more repeating or non-repeating cycles.

A determining circuit means in the form of a determining circuit 120 is provided in the circuit 100 as shown and is configured for determining a first set of one or more cycles, but preferably the first cycle of the pulse signal 116 generated by the signal generator 110 after a high impedance state of the signal load lines 185 coupled with the connection nodes 102, 104 in a manner to be described in greater detail below. As shown schematically in the figure, input signal lines 122, 124 of the determining circuit span the output 112 and a neutral datum 118 of signal generator 110 and input 126 is connected with a second control input signal 52 applied from an external source (not shown) to a switch 130 operative to interface the circuit 100 with an associated load 180 using associated intermediary load lines 185.

An output port 128 of the determining circuit 120 is coupled with a logic circuit means comprising circuit 140 which is in turn coupled with a switchable impedance circuit 150. Overall, the impedance circuit 150 is selectively switched between at least two different impedance states or modes in accordance with signals from the determining 120 and logic 140 circuits wherein a low impedance mode is used for the initial or first cycle of the pulse wave signal applied to the associated load 180 after a high impedance state of the signal load lines 185, and a high impedance mode (relative to the low impedance mode) is used thereafter for the subsequent cycles of the pulse wave signal applied to the load. The low impedance mode is referred to herein as the boost mode for delivering a boosted pulse signal to the associated signal line in a manner to be described more fully below. Embodiments of the circuit include several low impedance modes wherein operation in any of those modes will be referred to as the low impedance mode.

With continued reference to FIG. 1, in the example embodiment illustrated schematically, the circuit 100 is modeled as being operatively connected with an associated external load 180 by a pair of connection nodes 102, 104. The representative model load 180 is shown as including an intrinsic capacitance represented schematically by a single a capacitor 182 and an intrinsic internal resistance represented schematically by a single resistor 184. In the present disclosure, the capacitor 182 illustrated is representative of the inherent or initial residual capacitance of a load line typically found between pairs of electronic circuit elements or devices such as, for example, between an application specific integrated circuit (ASIC) and a memory device. By way of example, typical load line capacitances may range from 5 pf for a light load line to 20 pf for a heavy load line. Similarly, the resistor 184 illustrated is representative of the inherent non-reactive resistance of a load line typically found between devices such as the ASIC and memory mentioned above. By way of example, a typical load line resistance may be about 75 Ohms.

Figure 2:
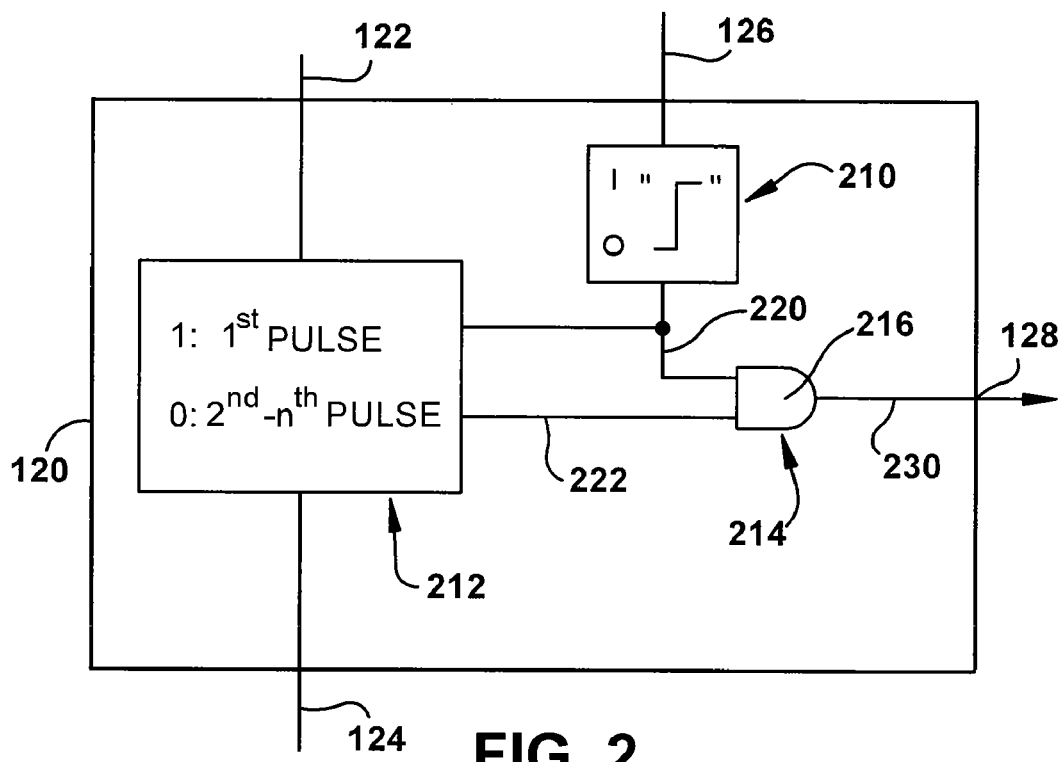
FIG. 2 illustrates an example of a determining circuit used in the driver circuit of FIG. 1.

With reference to FIG. 2, the example determining circuit 120 illustrated includes a first portion 210 configured to determine a high impedance condition of the signal load line 185 and a second portion 212 configured to determine a first set of one or more pulses of the series of pulses, and preferably the first pulse, from the signal generator 110 following the high impedance condition. In accordance with the example embodiment described herein, as used herein, the high impedance condition of the signal lines refers to the condition thereof prior to the application of signals thereto wherein the signal lines "float" or have an indeterminate voltage level or logic state relative to the signal generator 110. Also, in accordance with the example embodiment described herein, as used herein, the expression "first pulse" is used equivalently with the first set of one or more pulses following a high impedance state of the signal lines. The floating or high impedance condition is represented in the drawing schematically by an electronic switch 130 responsive to the second control signal 52 from an external associated source as described above. In a mode wherein the second control signal 52 is in a low or "0" logic level, the switch 120 is in an off state having an effect to open the circuit between the signal generator 110 and the load 180 wherein the signal line 185 may float in a higher impedance state. Likewise, in a mode wherein the second control signal 52 is in a high or "1" logic level, the switch 120 is in an on state having an effect to close the circuit between the signal generator 110 and the load 180 wherein the signal line 185 which may have been floating in the higher impedance state is connected with the generator 110. The embodiments provide a first boost pulse for this connection and condition.

Figure 3:
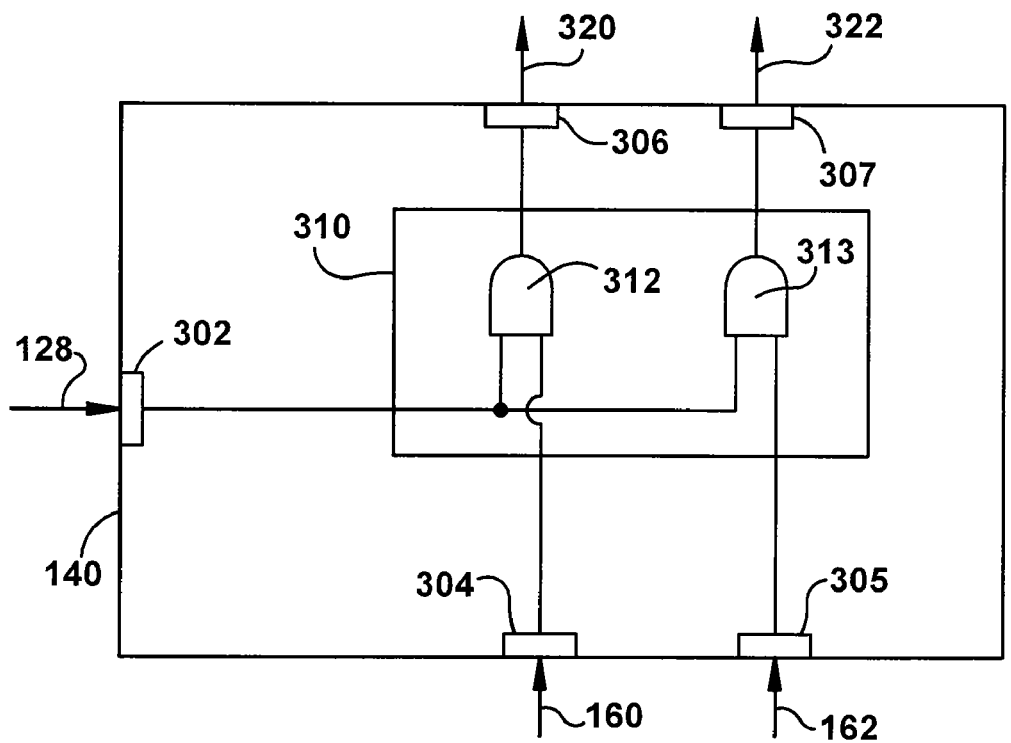
FIG. 3 illustrates an example of a logic circuit used in the driver circuit of FIG. 1.

An output 220 of the first portion 210 is combined at a third portion 214 of the determining circuit 120, shown schematically as an AND gate 216, together with an output 222 of the second portion 212, wherein an output signal 230 is selectively generated for use by the logic circuit (FIG. 3). More particularly, the output 230 is a logical "1" when both of the outputs 220, 222 of the first and second portions, respectively, are at a logical 1, and the output 230 is a logical "0" when one or both of the outputs 220, 222 of the first and second portions, respectively, are at a logical 0 state or level.

The first portion 210 of the determining circuit 120 is configured to determine a high impedance condition of the associated signal load line 185. In the circuit 100 of the example embodiment, an electronic switch 130 is used to selectively connect the signal generator 110 with the associated load 180 in response to the second control signal 52. Prior to the connection between the signal load lines 185 and the generator, the load lines may be floating or in one or more otherwise indefinable states. Accordingly, the first portion 210 is coupled with second control signal 52 and generates a logical 1 on a transition of the second control signal 52 from a logical 0 (open connection between signal generator 110 and load 180) to a logical 1 (closed connection between signal generator 110 and load 180) and thereafter for a predetermined selectable time period in accordance with a frequency of the pulse signal 116. In an example embodiment, the predetermined selectable time period is slightly larger than a period of the pulse signal 116. The operation of the first portion 210 in this manner is merely a preferred example embodiment and other circuits, means and methods may be used as well.

The second portion 212 of the determining circuit 120 is configured to determine the first set of one or more pulse cycles of a series of pulses generated by the signal generator 110. As shown schematically, the second portion 212 of the circuit generates a logical 1 when the first pulse cycle of the series of pulses is determined and generates a logical 0 during all other conditions. It is to be appreciated that although the example circuit generates a logical 1 when the first pulse cycle of the series of pulses is determined, other embodiments include generating a logical 1 when the first set of one or more pulses of the series of pulses is determined following the high impedance state of the signal lines. The second portion may include various circuits including logic gates, flip-flops or software stored in a memory and executable by a processor and, further, may be selectively resettable to determine subsequent first cycles after a termination of the sensing or for other reasons and/or conditions as desired. In this way, in circumstances when the signal 52 is applied prior to the signal 50 wherein the switch 130 is closed before initiation of the signal 116, the second portion 212 of the circuit generates a logical 1 when the first pulse cycle of the series of pulses is determined after closure of the switch and during the high impedance state or condition of the load lines 185. In addition, as shown in the figure, the output 220 of the first portion 210 is used by the second portion 212 to help set the timing of the signal 222 such as may be needed in circumstances wherein the signal generator 110 is free running and the switch 130 is closed asynchronously relative to the pulse signal 116. Preferably, the input 220 to the second portion 212 is used by the second portion to latch the output 222 thereof for at least the preamble portion or for at least one full cycle of the pulse signal. In alternative embodiment, the second control signal 52 may be coupled with the switch 130 by an intermediary timing circuit (not shown) wherein application of the control signal 52 to the switch 130 may be coordinated by the timing circuit to synchronize with the start of the next first full cycle of the pulse signal.

The logic circuit 140 is responsive to a first cycle signal 128 generated by the determining circuit 120, and to a control signal 160 received into the circuit 100 from an operatively associated external source, such as for example, from another circuit. The logic circuit 140 may be responsive to one or more additional or auxiliary control signals 162 received into the circuit as well in a manner to be described below. As shown in FIG. 3, the logic circuit 140 includes a first input circuit 302 for receiving the first cycle signal 128 generated by the determining circuit 120, a second input circuit 304 for receiving the control signal 160, a third input circuit 305 for receiving the auxiliary control signal 162, and a logic means such as a logic portion 310 for combining the signals 128, 160, 162 and, using processing and/or logic within the logic portion 310, generating first and second logical signals 320, 322 on output circuits 306, 307 thereof, respectively.

In the example embodiment illustrated, the logic portion 310 includes logic means such as first and second AND gates 312, 313 whereby the first logical signal 320 is at a logical high or "1" only when both of the first cycle signal 128 and the control signal 160 are at a logical high or "1" state. Similarly, the second logical signal 322 is at a logical high or "1" only when both of the first cycle signal 128 and the auxiliary control signal 162 are at a logical high or "1" state.

It is to be appreciated that the logic portion 310 may include or implement other means or forms of logic and other combinations of one or more logic gates or circuits such as including look up tables, one or more processors executing instructions stored in a memory, or the like, for generating the first and second logical signals 320, 322. For example, the control signal may comprise several separate control signal lines operatively connected with several different sources of control signals for logical combination by the logic portion 310 as necessary or desired.

Figures 4, 5:
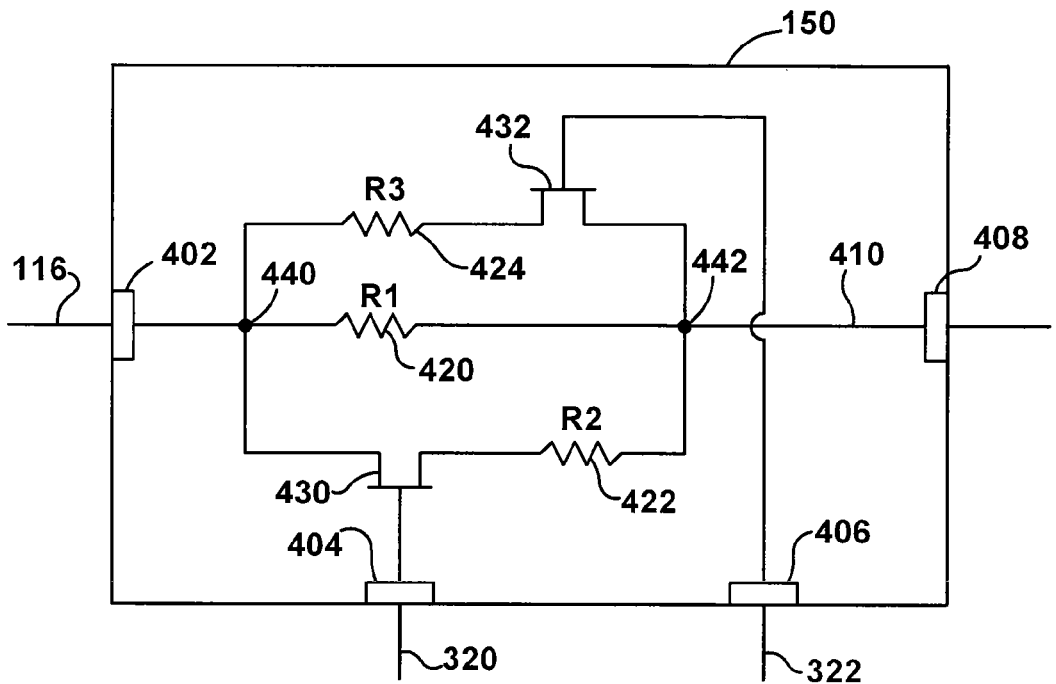
FIG. 4 illustrates an example switchable impedance circuit used in the driver circuit of FIG. 1.
FIG. 5 illustrates a table of modes of operation of the driver circuit of FIG. 1.

FIG. 4 is a schematic illustration of the switchable impedance means comprising circuit 150 in accordance with an example embodiment. As shown there, the circuit 150 includes a first input circuit 402 configured to receive the drive pulse wave signal 116 from the signal generator circuit 110 (FIG. 1), a second input circuit 404 configured to receive the first logical signal 320 from the logic circuit 140, and a third input circuit 406 configured to receive a second logical signal 322 from the logic circuit 140. An output port or circuit 408 is provided for communicating the modified pulse signal 410 from the switchable impedance circuit 150 to the connection node 102 of the circuit 100 (FIG. 1).

With continued reference to FIG. 4, the switchable impedance circuit 150 includes a base or default resistance 420 illustrated in the representative schematic circuit diagram as R1. As shown, the base resistance R1 provides a series resistance relative to the pulse signal 116 between the input port 402 and the output port 408 of the circuit 150. Accordingly, the modified pulse signal 410 delivered to the associated load 180 is derated relative to the original form of the pulse signal 116 by the power absorbed by the base resistance 420 of the switchable impedance circuit 150. In the example embodiment, the first resistor R1 is connected between the first input port 402 and the output port 408 in a fixed manner. That is, in the example embodiment, R1 is not selectively switchable into and out from operative connection in the circuit as with other components of the switched impedance circuit 150 in a manner to be described below. The first resistor R1 therefore provides a base resistance 420 used by the circuit of the example embodiment during a normal or high impedance operating mode, i.e. for all cycles of the output pulse wave signal after the first cycle and, selectively, for the first cycle in a manner to be described in greater detail below.

A second resistance 422 is illustrated in the schematic circuit diagram as a second resistor R2 and is configured to be selectively switched into and out from a parallel connection with the base resistance R1 by a first switch means, preferably a first transistor 430 in response to the logical level of the first logical signal 320. In particular, in the example embodiment, the first and second resistances R1, R2 are effectively connected in parallel at nodes 440, 442 when the first logical signal 320 is in a high or logical level "1" state. This is the low impedance operating mode of the circuit 150. However, when the first logical signal 320 is in a low or logical level "0" state, the second resistance R2 is effectively disconnected from the nodes 440, 442 by the non-conductive state of the first transistor 430, thereby opening this portion of the parallel circuit and removing the second resistance R2 from the voltage/current divider circuit.

By way of example, the first resistance 420 may have a value of about 38 Ohms and the second resistance 422 may have a value of about 423 Ohms. In that way, the effective resistance between the nodes 440, 442 is 38 Ohms when the first logical signal 320 is in a low or logic level "0" state (R2 leg of parallel circuit open), and the effective resistance between the nodes 440, 442 is about 34 Ohms when the first logical signal 320 is in a high or logic level "1" state (R2 leg of parallel circuit closed). It is to be appreciated that the former is the normal or default operating mode of the subject driver boost circuit 110, and the latter operational state provides boost energy to the original pulse signal 116 preferably sufficient to overcome the initial capacitance of the load line as will be described below in greater detail. However, in the example embodiment, a boost is provided to only the first cycle of the pulse driver boost signal 116 by virtue of a lower resistance value (34 Ohms) relative to the normal or default resistance value (38 Ohms) of the circuit for the second and all subsequent pulses of the pulse wave signal 116. It is to be appreciated that in other embodiments a boost is provided to the first set of one or more cycles of the pulse driver boost signal 116 by virtue of a lower resistance value (34 Ohms) relative to the normal or default resistance value (38 Ohms) of the circuit for all subsequent pulses of the pulse wave signal 116 following the first set of one or more cycles of the pulse driver boost signal.

With still yet continued reference to FIG. 4, the circuit 150 includes a third resistance 424 illustrated in the schematic circuit diagram as a third resistor R3. As shown, the third resistance 424 provides a parallel resistance relative to the first and second resistors R1, R2 between the circuit nodes 440, 442. Similar to the second resistance 422 described above, the third resistance 424 is configured to be selectively switched into and out from a parallel connection with the base resistance R1 by a second transistor 432 in response to the logic level of the second logical control signal 322. In that way, the second logical control signal 322 and the second transistor 432 may be used to further boost the portion of the pulse wave signal 116 delivered to the load 180 by effectively further reducing the effective series resistance between the nodes 440, 442 when the second logical control signal 322 is in a high or logical (1) state.

A table 500 is shown in FIG. 5 illustrating the several modes of operation of the circuit 100 of the example embodiment. In a first mode of operation 502, the first cycle signal 128 from the determining circuit 120 is at a low or logical level "0" state indicating that the pulses of the pulse signal 116 are not the initial or first cycle of the pulses. Accordingly, from the description above and in accordance with the example circuits shown in FIGS. 1-4, the effective series resistance to the pulse signal 116 from the signal generator 110 is R1. This represents the normal or nominal mode of operation of the circuit of the example embodiment in the high impedance operating mode without pulse signal boost, particularly, during the $2^{nd}$ through $n^{th}$ cycles of a series of pulses of a pulse wave signal.

In a second mode of operation 504, neither of the control signals 160, 162 are active, as at a logical "1" state wherein, in accordance with the example circuits shown in FIGS. 1-4, neither of the transistor switch means 430, 432 are conductive or closed. Therefore, the effective series resistance to the pulse signal 116 from the signal generator 110 is R1. Essentially, in this mode 504 of operation, no signal boost opportunity is provided to assist the pulse signal 116 in overcoming the initial capacitance 182 of the associated load 180. The effective internal resistance of switchable impedance circuit 150 is the value of the first resistance 420.

Figure 6:
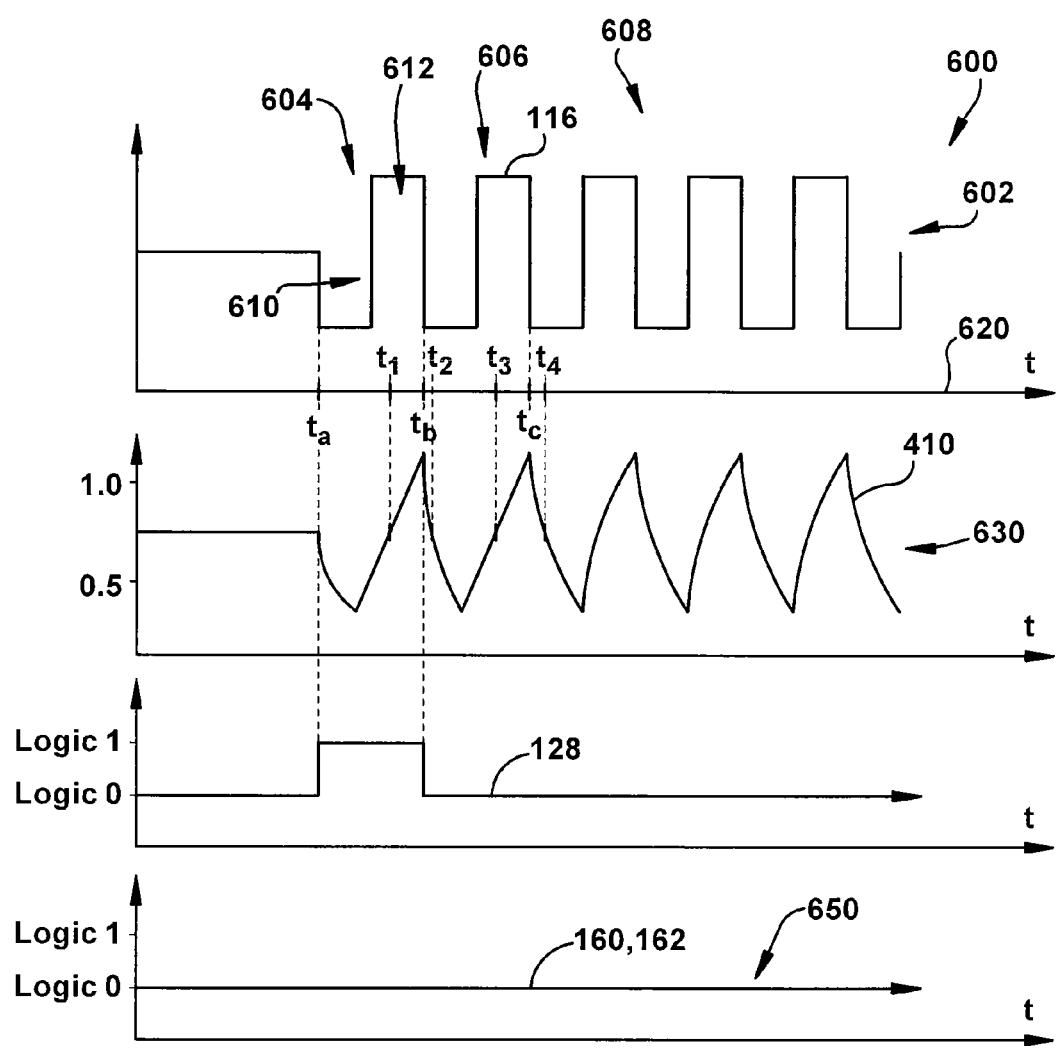
FIG. 6 illustrates example waveforms and an output of the circuit of FIG. 1 operated in a first mode without first cycle boost.

FIG. 6 is a chart set 600 of waveforms illustrating results of an application of a pulse signal onto a load in the second mode of operation 504, i.e., without first cycle boost wherein the inherent residual capacitance 182 of the load prior to application of the signal is about 20 pf, the first resistance R1 is about 38 Ohms and the original pulse signal cycle is about 937 psec. wide. The first waveform 602 illustrated is an example of a pulse wave signal 116 in accordance with an embodiment. A shown, the example pulse wave signal 116 has an overall shape of a square wave, although it is to be appreciated that the circuit 100 is operative with all forms of signals, and includes a first cycle 604 beginning, with reference to the time axis 620, at $t_a$ and ending at $t_b$. The $2^{nd}$ cycle 606 and all subsequent cycles 608 of the pulse wave signal 116 begin in the example at $t_b$. The first cycle 604 of the first waveform 602 of the pulse wave signal includes, in general, a negative going preamble portion 610 and a positive going pulse portion 612. In the example, the transition from the negative going preamble portion 610 to the positive going pulse portion 612 is at $t_c$ on the time axis.

The second waveform illustrated 630 is an example representation of the modified pulse signal 410 provided at the output node 408 of the switchable impedance circuit 150, an example of which was described above. The second waveform 630 also includes a first cycle 632 having a preamble portion 634 and a pulse portion 636 together with a sequence of additional pulses 638 substantially corresponding to the first waveform 602. The third waveform illustrated 128 is the first cycle signal output from the determining circuit 120. As described above, the determining circuit 120 is configured to generate the first cycle signal 128 when the signal generator 110 is generating the first cycle 505 of the pulse signal 116. The first cycle signal is high or a logic level "1" only during the period from $t_a$ to $t_b$.

The fourth waveform illustrated 650 is a logical OR combination of the first control signal 160 with the auxiliary or additional control signal 162 received into the logic circuit 140. As described above, without either of the first or additional control signals 156, 162 in their high or logical "1" states, neither of the switch means 430, 432 are conductive and thus, neither of the resistors 422, 424 are selectively connected in parallel with the first resistor 420.

With continued reference to FIG. 6, as can be seen, the first pulse of the modified pulse signal 410 is thin, about 900 ps wide, while the second pulse and pulses thereafter have a width of about 937 psec. On the time axis and, therefore approximates the original pulse signal relative to the time axis 620 with good fidelity. Operation of the subject circuit in this mode 504 demonstrates the desirability of a first pulse boost.

With reference once again to FIG. 5, the other modes of operation of the circuit 100 of the example embodiment include a third mode 506 wherein only the first cycle signal 128 of the determining circuit 120 and the auxiliary control signal 162 are in a high or logical "1" state. Similarly, in the fourth mode 508, only the first cycle signal 128 and the control signal 160 are in a high or logical "1" state. Lastly, in the fifth mode 510, all of the relevant signals including the first cycle signal 128 and the primary and auxiliary control signals 160, 162 are in a high or logical "1" state.

Figure 7:
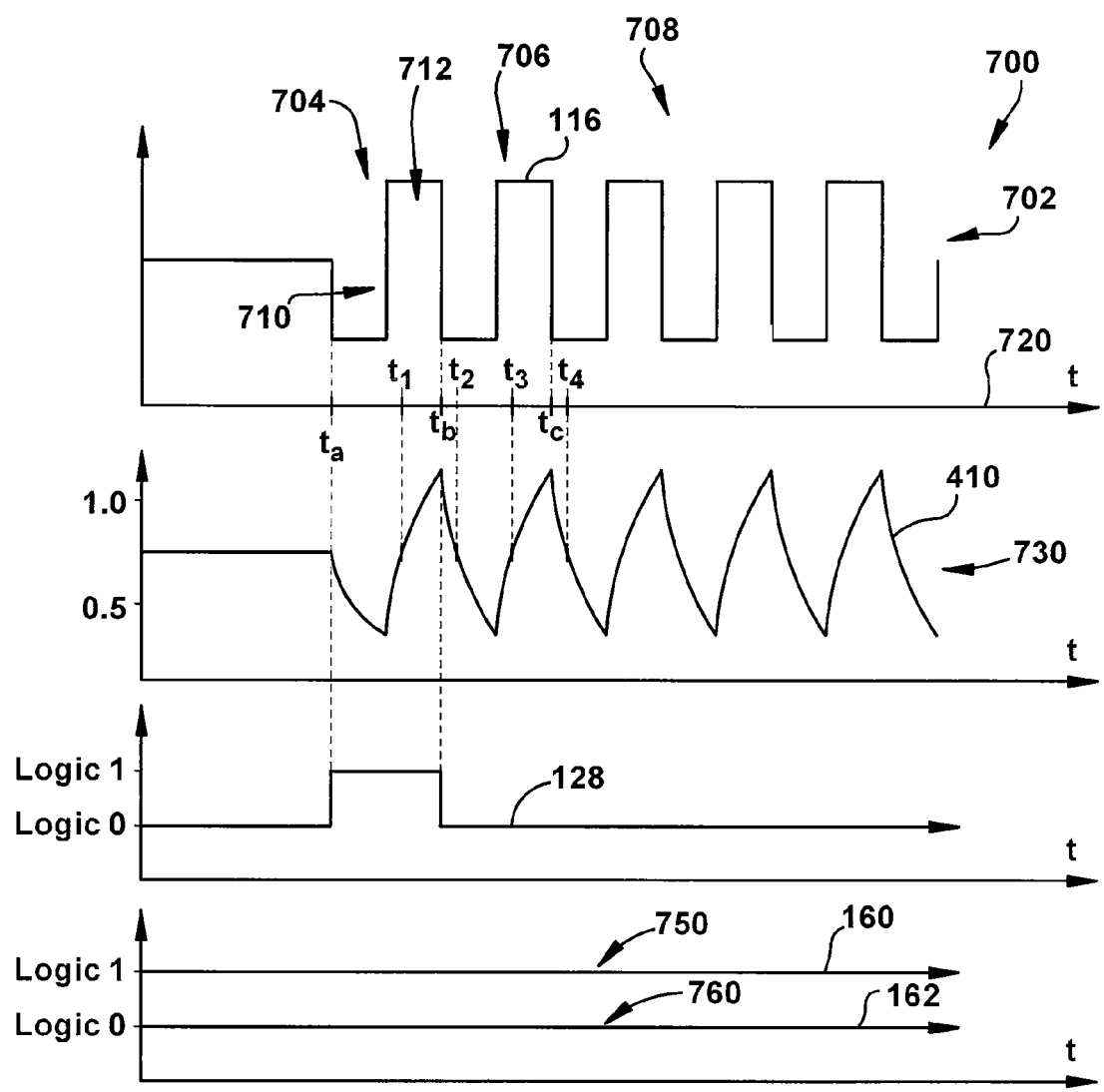
FIG. 7 illustrates example waveforms and an output of the circuit of FIG. 1 operated in a second mode with first cycle boost.

FIG. 7 shows a preferred operation of the subject circuit 100 in the fourth mode 508 (FIG. 5) in accordance of an example embodiment by way of a chart set 700 of waveforms illustrating results of an application of a pulse signal onto a load in the fourth mode of operation 508, i.e., with first cycle boost wherein the capacitance 182 of the load is about 20 pf, the first resistance R1 is about 38 Ohms and the original pulse signal cycle is about 937 psec. wide. The first waveform 702 illustrated is an example of a pulse wave signal 116 in accordance with an embodiment. A shown, the example pulse wave signal 116 has an overall shape of a square wave, although it is to be appreciated that the circuit 100 is operative with all forms of signals, and includes a first cycle 704 beginning, with reference to the time axis 720, at $t_a$ and ending at $t_b$. The $2^{nd}$ cycle 706 and all subsequent cycles 708 of the pulse wave signal 116 begin in the example at $t_b$. The first cycle 704 of the first waveform 702 of the pulse wave signal includes, in general, a negative going preamble portion 710 and a positive going pulse portion 712. In the example, the transition from the negative going preamble portion 710 to the positive going pulse portion 712 is at t, on the time axis. It is to be appreciated that, for performance comparison purposes, the first waveform 702 illustrated as the example of the pulse wave signal 116 is identical to the first waveform 602 of FIG. 6 showing operation of the circuit in the second mode 504 of operation, i.e. without pulse boost.

The second waveform illustrated 730 is an example representation of the modified pulse signal 410 provided at the output node 408 of the switchable impedance circuit 150, an example of which was described above. The second waveform 730 also includes a first cycle 732 having a preamble portion 734 and a pulse portion 736 together with a sequence of additional pulses 738 substantially corresponding to the first waveform 702. The third waveform illustrated 128 is the first cycle signal output from the determining circuit 120. As described above, the determining circuit 120 is configured to generate the first cycle signal 128 when the signal generator 110 is generating the first cycle 705 of the pulse signal 116. The first cycle signal is high or a logic level "1" only during the period from $t_a$ to $t_b$.

The fourth waveform illustrated 750 is the first control signal 160 and the fifth waveform illustrated 760 is the auxiliary or additional control signal 162 received into the logic circuit 130. As described above, when either of the first or additional control signals 160, 162 are in their high or logical "1" states, together with a high or a logic level "1" on the first cycle signal 128, the respective one or both of the switch means 430, 432 are conductive and thus, the respective one or both of the resistors 422, 424 are selectively connected in parallel with the first resistor 420.

With continued reference to FIG. 7, as can be seen, the first pulse of the modified pulse signal 710 is wide, about 938 ps wide, while the second pulse and pulses thereafter have a width of about 941 psec. on the time axis and, therefore approximates the original pulse signal relative to the time axis 720 with good fidelity for the second and ensuing pulses as well as for the first or initial pulse. Operation of the subject circuit in this third mode 506 demonstrates the desirability of a first pulse boost.

Figure 8:
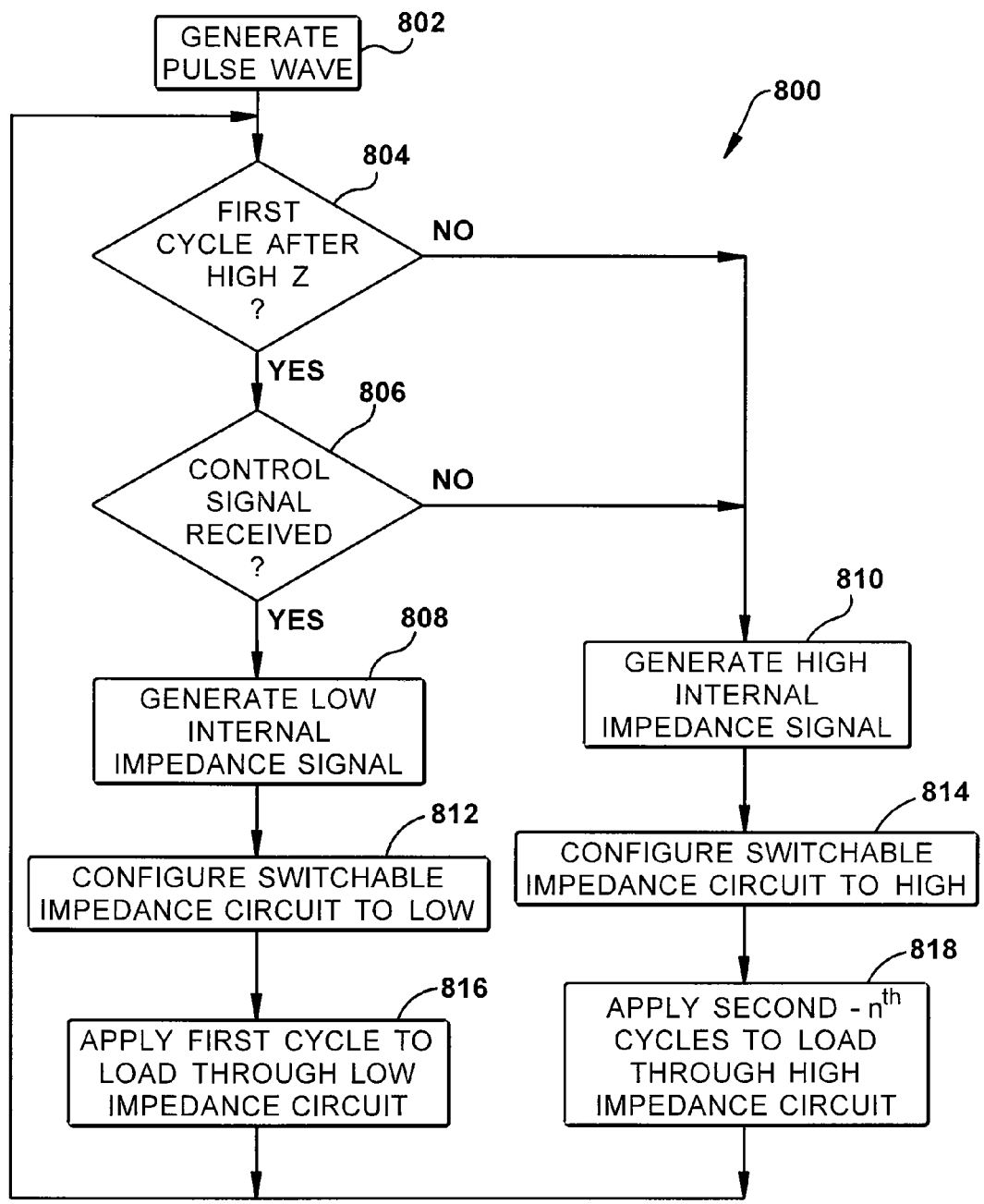
FIG. 8 is a flow diagram showing steps of operation of the circuit of FIGS. 1-4.

FIG. 8 is a flow chart illustrating a method 800 of operating a circuit to provide a boost to a first cycle of a signal in accordance with an example embodiment. With reference now to that figure, the method 800 includes generating a signal including a series of pulses at step 802. At 804, a first cycle of the series of pulses is determined. At 806, a receiving of a control signal is determined. At 808, a first logical signal is generated responsive to the control signal and to the determining the first cycle of the series of pulses, and a second logical signal different than the first logical signal is generated at 810 responsive to receiving the control signal and the determining of the series of pulses other than the first cycle. At 812, a first low impedance is provided between the signal generator and an associated load line responsive to the first logical signal generation, and at step 814 a second impedance level larger than the first impedance level is provided between the signal generator and the associated load line in response to the second logical signal. The first cycle is applied to the associated load through the low impedance circuit at step 816 and, correspondingly, the second through nth cycles are applied to the associated load through the high impedance circuit at step 818.

Figure 9:
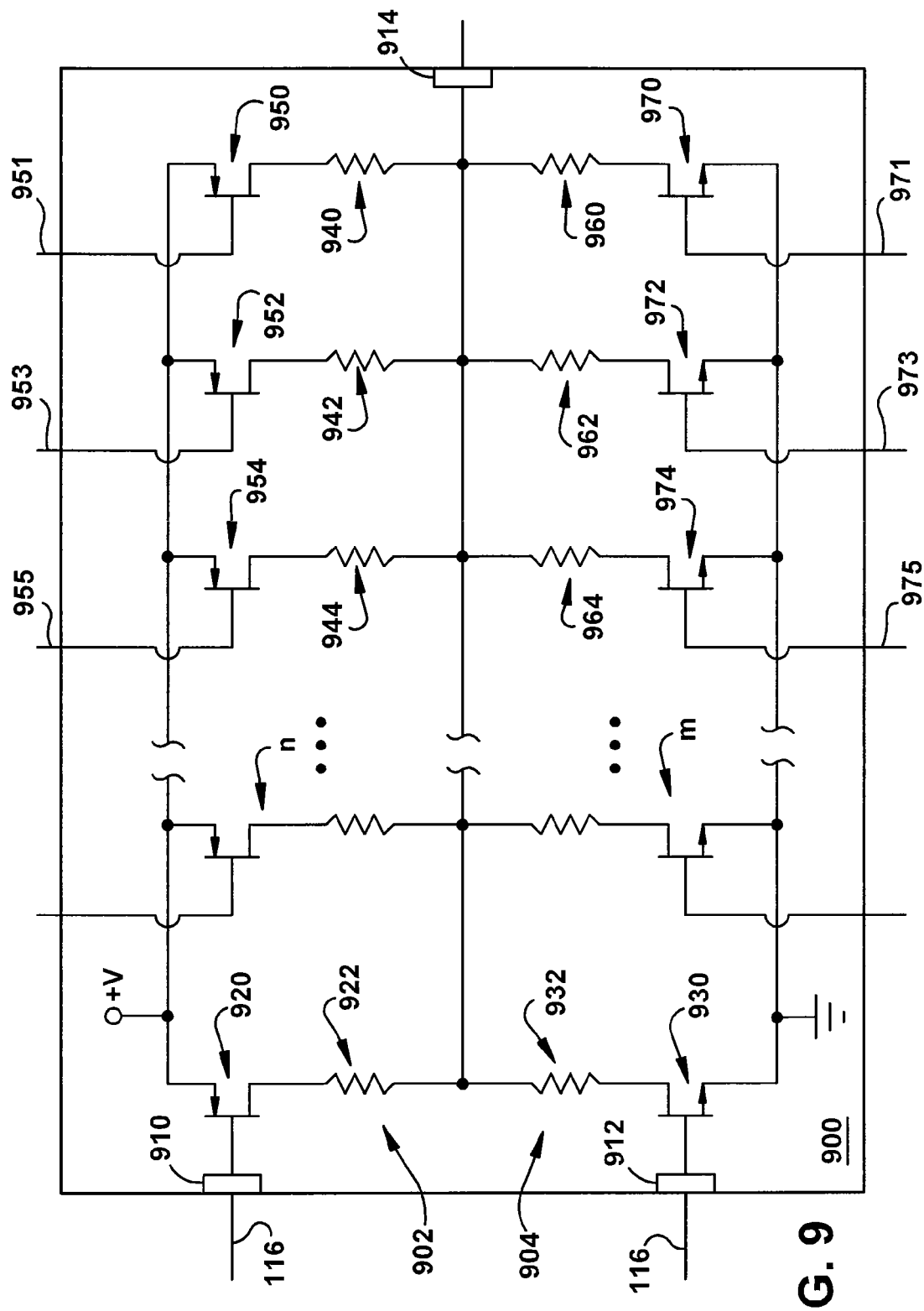
FIG. 9 illustrates a schematic of a switchable impedance circuit in accordance with a further example embodiment.

FIG. 9 is a schematic illustration of a switchable impedance circuit 900 in accordance with a further example embodiment. As shown there, the circuit 900 is generally symmetric in topology and accordingly includes a positive signal portion 902 and a negative signal portion 904. In general, the positive signal portion 902 receives and processes a portion of the pulse signal 116 received at the input port 910 above a threshold level for delivery to the associated load at an output port 914. Similarly, the negative signal portion 904 processes a portion of the pulse signal 116 below a threshold level for delivery to the associated load at an output port 914. It is to be appreciated that the signals comprising the upper and lower portions of the pulse signal 116 transition at a threshold level determined by transistor type and process.

In the normal or high impedance mode of operation, the portion of the pulse signal 116 above the predetermined threshold level urges a first transistor 920 into conduction whereby the input port 910 is effectively connected with the output port 914 through a first resistor 922. Further, also in the normal or high impedance mode of operation, the portion of the pulse signal 116 below the predetermined threshold level urges a second transistor 930 into conduction whereby the input port 910 is effectively connected with the output port 914 through a second resistor 932. In this example embodiment, the first and second resistors 922, 932 function in a manner similar to the base or default resistor 420 illustrated in the schematic circuit diagram of FIG. 4.

As shown, the base resistances 922, 932 provide a series resistance relative to the pulse signal 116 between the input ports 910, 912 and the output port 914 of the circuit 900 for alternate upper and lower portions of the signal 116. Accordingly, the modified pulse signal delivered at the node 102 (FIG. 1) to the associated load 180 is derated relative to the original form of the pulse signal 116 by the power alternately absorbed by the base resistances 922, 932 of the switchable impedance circuit 900. In the example embodiment, the first and second resistors 922, 932 are connected between the first and second transistors 920, 930 which are controlled by the portions of the signal 116. Accordingly, in the example embodiment, the first and second transistors 920, 930 are not selectively switchable into and out from operative connection in the circuit as with other components of the switched impedance circuit 900 in a manner to be described below. The first and second resistors 922, 932 therefore provide a base resistance used by the circuit of the example embodiment during a normal or high impedance operating mode, i.e. for all cycles of the output pulse wave signal after the first cycle and, selectively, for the first cycle in a manner to be described in greater detail below.

A plurality of third resistances 940-942 are configured to be selectively switched into and out from a parallel connection with the base resistance 922 by a corresponding plurality of switch means in the form of a plurality of selectively switchable transistors 950-954. There may be n resistor and switchable transistor pairs. Preferably, the transistors 950-954 are selectively conductive in response to the logical level of the control signals 951-955. In particular, in the example embodiment, the first resistance 922 is effectively connected in parallel with the resistance 940 when the logical signal 951 is in a high or logical level "1" state. This provides one of the low impedance operating modes of the circuit 900. However, when the logical signal 951 is in a low or logical level "0" state, the resistance 940 is effectively disconnected from the output node 914 by the non-conductive state of the first transistor 950, thereby opening this portion of the parallel circuit and removing the resistance 940 from the voltage/current divider circuit. Similarly, the first resistance 922 is effectively connected in parallel with the resistances 942, 944 when the logical signals 953, 955 are in a high or logical level "1" state, respectively. This provides additional low impedance operating modes of the circuit 900. However, when the logical signals 953, 955 are in a low or logical level "0" state, the resistances 942, 944 are effectively disconnected from the output node 914 by the non-conductive state of the switch transistors 952, 954, thereby opening this portion of the parallel circuit and removing the resistances 952, 954 from the voltage/current divider circuit. It is to be appreciated that any one or more of the switch transistors 950-954 may be operated independently and that the resistors 940-944 may have different resistance characteristics and values relative to each other. In this way, the circuit 900 provides enhanced flexibility in the boost characteristics of signal 166 as may be necessary or desired.

In addition to the above, the negative signal portion 904 of the example switchable impedance circuit 900 includes similar components and is operative similarly wherein a plurality of resistors 960-964 are selectively switched into and out of parallel connection with the second resistor 932 by operation of switch transistors 970-974 in response to a set of signals 971-973 from an external associated source. There may be m resistor and switchable transistor pairs. In one example embodiment, m=n and in another example embodiment, m≠n. In the circuit 900, operation of any one or more of the switch transistors 950-954 or 970-974 effects the low impedance mode of the embodiment, such as similar to the modes 506-510 (FIG. 5) discussed above.

Figure 10:
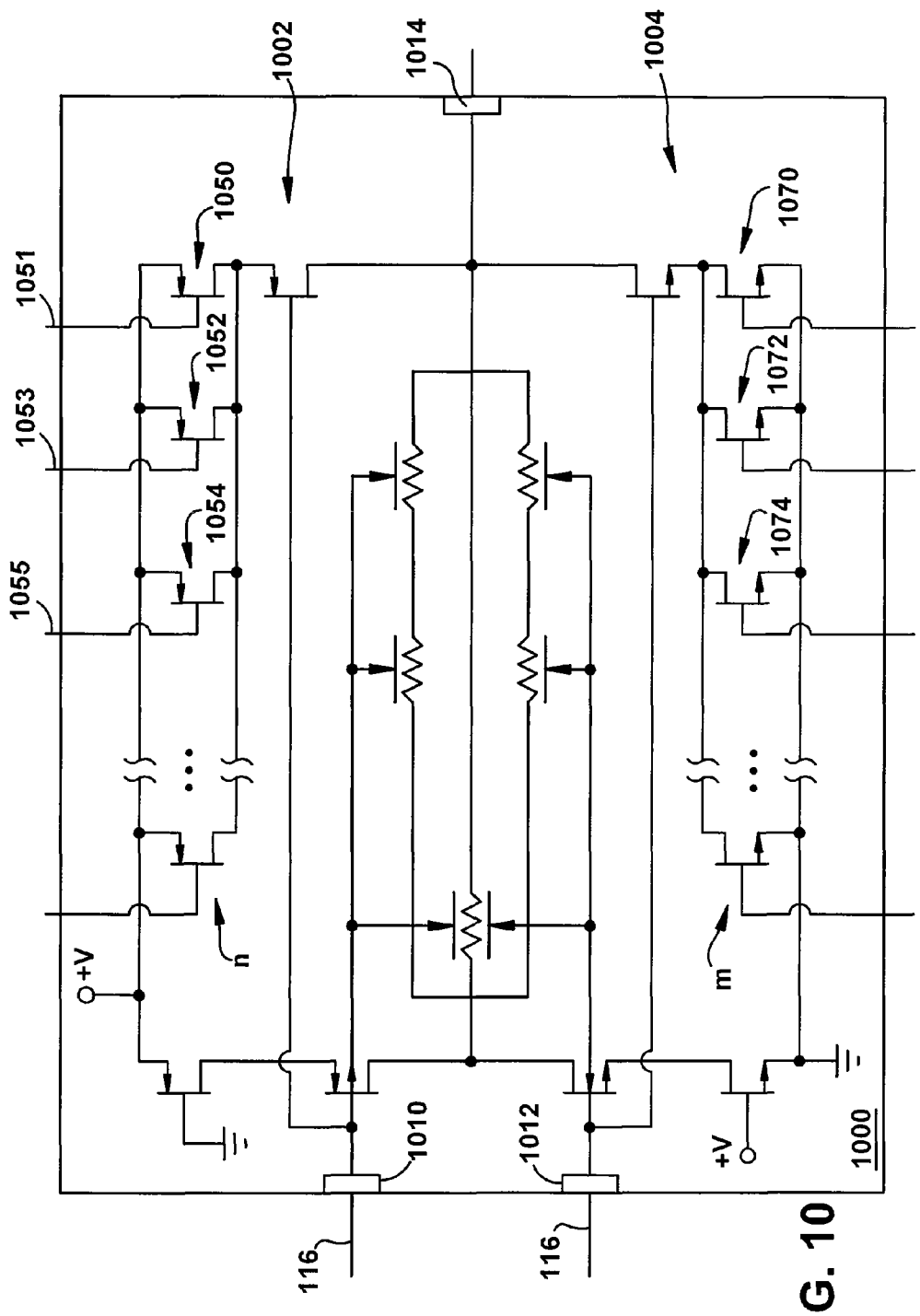
FIG. 10 illustrates a schematic of a switchable impedance circuit in accordance with a still further example embodiment.

FIG. 10 illustrates a schematic of a switchable impedance circuit 1000 in accordance with a still further example embodiment. As shown there and similar to the example circuit of FIG. 9, the circuit 1000 is generally symmetric in topology and accordingly includes a positive signal portion 1002 and a negative signal portion 1004. Similar to the circuit of FIG. 9, the positive signal portion 1002 receives and processes a portion of the pulse signal 116 above a threshold level determined by transistor type and process at an input port 1010 of the circuit 1000 for delivery to the associated load at an output port 1014. Similarly, the negative signal portion 1004 receives and processes a portion of the pulse signal 116 below a threshold level determined by transistor type and process at an input port 1012 of the circuit 1000 for delivery to the associated load at an output port 1014.

In the normal or high impedance mode of operation, the portion of the pulse signal 116 above the predetermined threshold level urges a first transistor 1020 into conduction whereby the input port 1010 is effectively connected with the output port 1014. In the example circuit 1000 illustrated, the first transistor has a preselected internal resistance. In one example, the preselected internal resistance is about 240 ohms. However, other devices having different internal resistances may be used as necessary or desired. Also in the normal or high impedance mode of operation, the portion of the pulse signal 116 below the predetermined threshold level urges a second transistor 1030 into conduction whereby the input port 1010 is effectively connected with the output port 1014 through a second internal or inherent resistance of the second transistor 1030. In this example embodiment, the internal resistors of the first and second tranistors 1022, 1032 function in a manner similar to the base or default resistor 420 illustrated in the schematic circuit diagram of FIG. 4.

As shown, the internal resistances of the base transistors 1020, 1030 provide a series resistance relative to the pulse signal 116 between the input ports 1010, 1012 and the output port 1014 of the circuit 1000 for alternate upper and lower portions of the signal 116. Accordingly, the modified pulse signal delivered at the node 102 (FIG. 1) to the associated load 180 is derated relative to the original form of the pulse signal 116 by the power alternately absorbed by the inherent resistances of the transistors 1020, 1030 of the switchable impedance circuit 1000. In the example embodiment, the first and second resistances are internally provided within the first and second transistors 1020, 1030 which are controlled by the portions of the signal 116. Further, in the example embodiment, the first and second transistors 1020, 1030 are not selectively switchable into and out from operative connection in the circuit as with other components of the switched impedance circuit 1000 in a manner to be described below. The first and second internal resistors therefore provide a base resistance used by the circuit of the example embodiment during a normal or high impedance operating mode, i.e. for all cycles of the output pulse wave signal after the first cycle and, selectively, for the first cycle in a manner to be described in greater detail below.

A plurality of third resistances are configured to be selectively switched into and out from a parallel connection with the base resistance of the base transistor 1020 by a corresponding plurality of switch means in the form of a plurality of selectively switchable transistors 1050-1054, each having a preselected inherent internal resistance. Preferably, the transistors 1050-1054 are selectively conductive in response to the logical level of the control signals 1051-1055. In particular, in the example embodiment, the first internal resistance of transistor 1022 is effectively connected in parallel with the resistance of the transistor 1040 when the logical signal 1051 is in a high or logical level "1" state. This provides one of the low impedance operating modes of the circuit 1000. However, when the logical signal 1051 is in a low or logical level "0" state, the resistance of transistor 1040 is effectively disconnected from the output node 1014 by the non-conductive state of the first transistor 1050, thereby opening this portion of the parallel circuit and removing the resistance 1040 from the voltage/current divider circuit. Similarly, the first resistance of transistor 1022 is effectively connected in parallel with the resistances of transistors 1052, 1054 when the logical signals 1053, 1055 are in a high or logical level "1" state, respectively. This provides additional low impedance operating modes of the circuit 1000. However, when the logical signals 1053, 1055 are in a low or logical level "0" state, the resistances of transistors 1052, 1054 are effectively disconnected from the output node 1014 by the non-conductive state of the switch transistors 1052, 1054, thereby opening this portion of the parallel circuit and removing the resistances of transistors 1052, 1054 from the voltage/current divider circuit. It is to be appreciated that any one or more of the switch transistors 1050-1054 may be operated independently and that the inherent internal resistances thereof may be selected to have different resistance characteristics and values relative to each other. In this way, the circuit 1000 provides enhanced flexibility in the boost characteristics of signal 166 as may be necessary or desired.

In addition to the above, the negative signal portion 1004 of the example switchable impedance circuit 1000 includes similar components and is operative similarly wherein a plurality of effective internal or inherent resistors are selectively switched into and out of parallel connection with the second resistor of transistor 1032 by operation of switch transistors 1070-1074 in response to a set of signals 1071-1073 from an external associated source. In the circuit 1000, operation of any one or more of the switch transistors 1050-1054 or 1070-1074 effects the low impedance mode of the embodiment, such as similar to the modes 506-510 (FIG. 5) discussed above.

Described above are example embodiments. It is, of course, not possible to describe every conceivable combination of components or methodologies, but one of ordinary skill in the art will recognize that many further combinations and permutations of the example embodiments are possible. Accordingly, this application is intended to embrace all such alterations, modifications, and variations that fall within the spirit and scope of the appended claims interpreted in accordance with the breath to which are fairly, legally, and equitably entitled.

The invention claimed is:
1. A driver boost signaling circuit comprising:
a signal generator circuit configured to generate a signal including a series of pulses on an associated signal load line;
a determining circuit including a first portion configured to determine a high impedance condition of the associated signal load line, and a second portion configured to determine a first set of one or more pulses of the series of pulses applied to the associated signal load line a predetermined time following the high impedance condition;
a receiving circuit configured to receive a control signal;
a logic circuit configured to generate a first logical signal responsive to the control signal and to the determining circuit determining the first set of one or more pulses of the series of pulses applied to the associated signal load line following the high impedance condition, and to generate a second logical signal different than the first logical signal responsive to the control signal and to the determining circuit determining pulses of the series of pulses other than the first set of one or more pulses; and,
a switchable impedance circuit operatively coupling the signal generator with the associated signal load line, the switchable impedance circuit being responsive to the first logical signal of the logic circuit to provide a first impedance level between the signal generator circuit and the associated signal load line, and being responsive to the second logical signal of the logic circuit to provide a second impedance level larger than the first impedance between the signal generator circuit and the associated signal load line.

2. The driver boost signaling circuit according to claim 1, wherein:
the signal generator circuit is configured to generate the series of pulses including a sequence of $1^{st}$ to $n^{th}$ pulses; and,
the logic circuit is configured to generate: i) the first logical signal responsive to the control signal, and to the determining circuit determining the $1^{st}$ pulse of the series of pulses, and ii) the second logical signal different than the first logical signal responsive to the control signal, and to the determining circuit determining the $2^{nd}$ to $n^{th}$ pulses of the series of pulses other than the first pulse.

3. The driver boost signaling circuit according to claim 1, wherein:
the signal generator circuit is configured to generate the signal including the series of pulses, wherein the series of pulses defines a series of cycles of the pulses;
the determining circuit is configured to determine a first cycle of the series of cycles of the pulses; and,
the logic circuit is configured to generate the first logical signal responsive to the control signal and to the determining circuit determining the first cycle of the series of cycles, and to generate the second logical signal different than the first logical signal responsive to the control signal and to the determining circuit determining cycles of the series of cycles other than the first cycle of the series of cycles.

4. The driver boost signaling circuit according to claim 3, wherein:
the signal generator circuit is configured to generate the series of cycles including a sequence of $1^{st}$ to $n^{th}$ cycles; and,
the logic circuit is configured to generate: i) the first logical signal responsive to the control signal, and to the determining circuit determining the $1^{st}$ cycle of the series of cycles, and ii) the second logical signal different than the first logical signal responsive to the control signal, and to the determining circuit determining the $2^{nd}$ to $n^{th}$ cycles of the series of cycles other than the first cycle.

5. The driver boost signaling circuit according to claim 1, wherein:
the signal generator circuit is configured to generate the signal including the series of pulses, wherein the series of pulses defines a series of cycles of the pulses;
the determining circuit is configured to determine a first portion of a first cycle of the series of cycles, the first portion including a preamble portion of the first cycle; and,
the logic circuit is configured to generate the first logical signal responsive to the control signal and to the determining circuit determining the first portion of the first cycle of the series of cycles, and to generate the second logical signal different than the first logical signal responsive to the control signal and to the determining circuit determining cycles of the series of cycles other than the first cycle.

6. The driver boost signaling circuit according to claim 1, wherein:
the signal generator circuit is configured to generate the signal including the series of pulses, wherein the series of pulses defines a series of cycles of the pulses;
the determining circuit is configured to determine first and second portions of a first cycle of the series of cycles, the first portion including a negative going preamble portion of the first cycle and the second portion including a positive going pulse portion of the first cycle; and,
the logic circuit is configured to generate the first logical signal responsive to the control signal and to the determining circuit determining the first and second portions the first cycle of the series of cycles, and to generate the second logical signal different than the first logical signal responsive to the control signal and to the determining circuit determining cycles of the series of cycles other than the first cycle of the series of cycles.

7. The driver boost signaling circuit according to claim 1, wherein:
the receiving circuit is configured to receive a second control signal from an operatively associated external source;
the logic circuit is configured to generate a third logical signal responsive to the second control signal and to the determining circuit determining the first pulse of the series of pulses; and,
the switchable impedance circuit is responsive to the third logical signal of the logic circuit to provide a third impedance level between the signal generator circuit and the associated signal load line, and is responsive to the second logical signal of the logic circuit to provide a second impedance level larger than the third impedance between the signal generator circuit and the associated signal load line.

8. A method of first pulse boost for use in a driver boost signaling circuit, the method comprising:
generating on an associated signal load line, by a signal generator circuit of the boost signaling circuit, a signal including a series of pulses;
determining, by a determining circuit of the boost signaling circuit, a high impedance condition of the associated signal load line, and a first set of one or more pulses of the series of pulses applied to the associated signal line a predetermined time following the high impedance condition;
receiving, by a receiving circuit of the boost signaling circuit, a control signal;
generating, by a logic circuit of the boost signaling circuit, a first logical signal responsive to the control signal and to the determining the first set of one or more pulses of the series of pulses applied to the associated signal load line following the high impedance condition, and a second logical signal different than the first logical signal responsive to the control signal and to the determining pulses of the series of pulses other than the first pulse; and,
providing, by a switchable impedance circuit of the boost signaling circuit operatively coupling the signal generator with the associated signal load line, a first impedance level between the signal generator circuit and the associated signal load line responsive to the first logical signal of the logic circuit, and a second impedance level larger than the first impedance between the signal generator circuit and the associated signal load line responsive to the second logical signal of the logic circuit.

9. The method according to claim 8, wherein:
the generating the series of pulses includes generating a sequence of $1^{st}$ to $n^{th}$ pulses; and,
the generating the first and second logical signals includes generating i) the first logical signal responsive to receiving the control signal, and to the determining the $1^{st}$ pulse of the series of pulses, and ii) the second logical signal responsive to receiving the control signal, and to determining the $2^{nd}$ to $n^{th}$ pulses of the series of pulses other than the first pulse.

10. The method according to claim 8, wherein:
the generating the signal includes generating the series of pulses, wherein the series of pulses defines a series of cycles of the pulses;
the determining includes determining a first cycle of the series of cycles;
the generating the first logical signal includes generating the first logical signal responsive to the control signal and to the determining the first cycle of the series of cycles; and,
the generating the second logical signal includes generating the second logical signal responsive to the control signal and to the determining cycles of the series of cycles other than the first cycle of the series of cycles.

11. The method according to claim 10, wherein:
the generating the series of cycles includes generating a sequence of $1^{st}$ to $n^{th}$ cycles;
the generating the first logical signal includes generating the first logical signal responsive to the control signal, and to the determining the $1^{st}$ cycle of the series of cycles; and,
the generating the second logical signal includes generating the second logical signal responsive to the control signal, and to the determining the $2^{nd}$ to $n^{th}$ cycles of the series of cycles.

12. The method according to claim 8, wherein:
the generating the signal including the series of pulses includes generating the signal including the series of pulses, wherein the series of pulses defines a series of cycles of the pulses;
the determining includes determining a first portion of a first cycle of the series of cycles, the first portion including a preamble portion of the first cycle;
the generating the first logic signal includes generating the first logical signal responsive to the control signal and to the determining the first portion of the first cycle of the series of cycles; and,
the generating the second logic signal includes generating the second logic signal responsive to the control signal and to the determining cycles of the series of cycles other than the first cycle.

13. The method according to claim 8, wherein:
the generating the signal including the series of pulses includes generating the signal including the series of pulses, wherein the series of pulses defines a series of cycles of the pulses;
the determining includes determining first and second portions of a first cycle of the series of cycles, the first portion including a negative going preamble portion of the first cycle and the second portion including a positive going pulse portion of the first cycle;
the generating the first logical signal includes generating the first logical signal responsive to the control signal and to the determining the first and second portions the first cycle of the series of cycles; and,
the generating the second logical signal includes generating the second logical signal responsive to the control signal and to the determining cycles of the series of cycles other than the first cycle of the series of cycles.

14. The method according to claim 8, further comprising:
receiving a second control signal from an operatively associated external source;
generating a third logical signal by the logic circuit responsive to the second control signal and to the determining the first pulse of the series of pulses; and,
providing a third impedance level different than the first impedance level between the signal generator circuit and the associated signal load line by the switchable impedance circuit responsive to the third logical signal.

15. A driver boost signaling circuit comprising:
signal generator circuit means for generating a signal including a series of pulses on an associated signal load line;
determining circuit means including a first portion for determining a high impedance condition of the associated signal load line, and a second portion for determining a first set of one or more pulses of the series of pulses applied to the associated signal load line a predetermined time following the high impedance condition;
receiving circuit means for receiving a control signal;
logic circuit means for generating a first logical signal responsive to the control signal and to the determining circuit means determining the first set of one or more pulses of the series of pulses applied to the associated signal load line following the high impedance condition, and for generating a second logical signal different than the first logical signal responsive to the control signal and to the determining circuit means determining pulses of the series of pulses other than the first pulse; and,
switchable impedance circuit means operatively coupling the signal generator means with the associated signal load line, the switchable impedance circuit means being responsive to the first logical signal of the logic circuit means to provide a first impedance level between the signal generator circuit means and the associated signal load line, and being responsive to the second logical signal of the logic circuit means to provide a second impedance level larger than the first impedance between the signal generator circuit means and the associated signal load line.

16. The driver boost signaling circuit according to claim 15, wherein:
the signal generator circuit means is configured to generate the series of pulses including a sequence of $1^{st}$ to $n^{th}$ pulses; and,
the logic circuit means is configured to generate: i) the first logical signal responsive to the control signal, and to the determining circuit means determining the $1^{st}$ pulse of the series of pulses, and ii) the second logical signal different than the first logical signal responsive to the control signal, and to the determining circuit means determining the $2^{nd}$ to $n^{th}$ pulses of the series of pulses other than the first pulse.

17. The driver boost signaling circuit according to claim 15, wherein:
the signal generator circuit means is configured to generate the signal including the series of pulses, wherein the series of pulses defines a series of cycles of the pulses;
the determining circuit means is configured to determine a first cycle of the series of cycles; and,
the logic circuit means is configured to generate the first logical signal responsive to the control signal and to the determining circuit means determining the first cycle of the series of cycles, and to generate the second logical signal different than the first logical signal responsive to the control signal and to the determining circuit means determining cycles of the series of cycles other than the first cycle of the series of cycles.

18. The driver boost signaling circuit according to claim 17, wherein:
the signal generator circuit means is configured to generate the series of cycles including a sequence of $1^{st}$ to $n^{th}$ cycles; and, the logic circuit means is configured to generate: i) the first logical signal responsive to the control signal, and to the determining circuit means determining the $1^{st}$ cycle of the series of cycles, and ii) the second logical signal different than the first logical signal responsive to the control signal, and to the determining circuit means determining the $2^{nd}$ to $n^{th}$ cycles of the series of cycles other than the first cycle.

19. The driver boost signaling circuit according to claim 15, wherein:

the signal generator circuit means is configured to generate the signal including the series of pulses, wherein the series of pulses defines a series of cycles of the pulses;

the determining circuit means is configured to determine a first portion of a first cycle of the series of cycles, the first portion including a preamble portion of the first cycle; and, the logic circuit means is configured to generate the first logical signal responsive to the control signal and to the determining circuit means determining the first portion of the first cycle of the series of cycles, and to generate the second logical signal different than the first logical signal responsive to the control signal and to the determining circuit means determining cycles of the series of cycles other than the first cycle of the series of cycles.

20. The driver boost signaling circuit according to claim 15, wherein:

the signal generator circuit means is configured to generate the signal including the series of pulses, wherein the series of pulses defines a series of cycles of the pulses;

the determining circuit means is configured to determine first and second portions of a first cycle of the series of cycles, the first portion including a negative going preamble portion of the first cycle and the second portion including a positive going pulse portion of the first cycle; and, the logic circuit means is configured to generate the first logical signal responsive to the control signal and to the determining circuit means determining the first and second portions the first cycle of the series of cycles, and to generate the second logical signal different than the first logical signal responsive to the control signal and to the determining circuit means determining cycles of the series of cycles other than the first cycle.

* * * * *